United States Patent [19]
Nishizawa et al.

[11] Patent Number: 5,117,268
[45] Date of Patent: May 26, 1992

[54] THERMIONIC EMISSION TYPE STATIC INDUCTION TRANSISTOR AND ITS INTEGRATED CIRCUIT

[75] Inventors: Junichi Nishizawa; Kaoru Motoya, both of Sendai, Japan

[73] Assignees: Research Development Corp., Tokyo; Junichi Nishizawa; Kaoru Motoya, both of Miyagi, all of Japan

[21] Appl. No.: 469,226

[22] Filed: Jan. 24, 1990

Related U.S. Application Data

[63] Continuation of Ser. No. 227,427, Jul. 29, 1988, abandoned, which is a continuation of Ser. No. 57,333, Jun. 2, 1987, abandoned, which is a continuation of Ser. No. 759,090, Jul. 25, 1985, Pat. No. 4,712,122.

[30] Foreign Application Priority Data

Jul. 26, 1984 [JP] Japan .................. 59-153969
Jul. 26, 1984 [JP] Japan .................. 59-153972

[51] Int. Cl.⁵ ........................... H01L 29/80
[52] U.S. Cl. ........................... 357/22; 357/16
[58] Field of Search ............... 357/22 E, 22 A, 22 D, 357/22 R, 22 B, 16

[56] References Cited

U.S. PATENT DOCUMENTS

| | | | |
|---|---|---|---|
| 4,326,209 | 4/1982 | Nishizawa et al. | 357/22 E |
| 4,470,059 | 9/1984 | Nishizawa et al. | 357/23.4 |
| 4,484,207 | 11/1984 | Nishizawa et al. | 357/22 E |
| 4,504,847 | 3/1985 | Nishizawa | 357/22 |
| 4,712,122 | 12/1987 | Nishizawa et al. | 357/22 E |
| 4,870,469 | 9/1989 | Nishizawa et al. | 357/22 |

FOREIGN PATENT DOCUMENTS 57-75464  5/1982  Japan ..................... 357/22

*Primary Examiner*—Rolf Hille
*Assistant Examiner*—Steven Loke
*Attorney, Agent, or Firm*—Darby & Darby

[57] ABSTRACT

In a static induction transistor of thermionic emission type, its gate region is formed of a semiconductor having a forbidden band gap larger than that of a semiconductor forming its channel region, and the distance between a source region and the intrinsic gate region is selected to be smaller than the mean free path of carriers so as to permit the thermionic emission. Such a vertical structure transistor is also applied to an integrated circuit.

11 Claims, 5 Drawing Sheets

THERMIONIC EMISSION TYPE STATIC INDUCTION TRANSISTOR AND ITS INTEGRATED CIRCUIT

This is a continuation of application Ser. No. 227,427, filed Jul. 29, 1988, now abandoned; which was a continuation of application Ser. No. 057,333, filed Jun. 2, 1987, now abandoned, which was a continuation of application Ser. No. 759,090, filed Jul. 25, 1985, now U.S. Pat. No. 4,712,122.

FIELD OF THE INVENTION

This invention relates to a static induction transistor (abbreviated hereinafter as a SIT) and an integrated circuit of such a transistor. More particularly, this invention relates to a thermionic emission type SIT constructed to operate according to the principle of thermionic emission so that the SIT can operate at a high speed, and relates also to an integrated circuit of such a transistor.

DESCRIPTION OF THE PRIOR ART

An SIT is a transistor in which the level of the potential barrier height established by a depletion layer extending between gate regions is changed to control current flowing between a source region and a drain region. In such a transistor, the potential is controlled through the electrostatic capacitance of the depletion layer. Therefore, the SIT is equivalent to a bipolar transistor from which the storage capacitance of its base layer is eliminated. Thus, the SIT is excellent over an FET (a field effect transistor) in that it operates at a very higher speed with lower noise.

However, a prior art SIT, in which the distance between the source and the drain region, and that between the source and the gate regions are considerably larger, has had such a disadvantage that carriers tend to be scattered by crystal lattices resulting in a limited cut-off frequency.

SUMMARY OF THE INVENTION

With a view to obviate the prior art disadvantage described above, it is a primary object of the present invention to provide a novel thermionic emission type SIT in which carriers can drift at the velocity of thermionic without being scattered by the crystal lattices and also to provide a semiconductor integrated circuit including such a novel thermionic emission type SIT.

In accordance with one aspect of the present invention which attains the above object, there is provided a SIT of thermionic emission type comprising a channel region, a source region and a drain region having a high impurity concentration and formed in contact with both sides respectively of the channel region, and a gate region making contact with part or the whole of the channel region and formed of a semiconductor having a forbidden band gap larger than that of the semiconductor forming the channel region, the distance from the source region to the intrinsic gate region being selected to be smaller than the mean free path of carriers.

Thus, according to the first feature described above, carriers are hardly diffracted by crystal lattices and can drift at a high speed, whereby a high-speed SIT can be provided.

In addition to the first feature, it is a second feature of the present invention that, in such an SIT, the width of the channel region is selected to be smaller than $2\lambda_D$, where $\lambda_D$ is the Debye length determined by the impurity concentration of the channel region.

According to this second feature, the mutual conductance Gm determined by both of the gate control voltage and the drain current increases so that the cut-off frequency characteristic can be greatly improved.

In addition to the first feature, it is a third feature of the present invention that, in such an SIT, the composition of the semiconductor forming the gate region is modified so as to attain coincidence between the semiconductor lattice constant of the gate region and that of the channel region.

According to this third feature, the surface level at the boundary surface of the gate region decreases to improve the source-gate breakdown voltage characteristic so that the leakage current can be decreased to reduce the power consumption.

In accordance with another aspect of the present invention, there is provided a semiconductor integrated circuit comprising a SIT of thermionic emission type incorporated therein, the transistor comprising a drain region having a high impurity concentration and formed in part of at least one of the major surfaces of an intrinsic semiconductor or a semi-insulating semiconductor, a channel region formed on the drain region, a source region formed on the channel region, and a gate region disposed in contact with the side of the channel region and formed of a semiconductor having a forbidden band gap larger than that of the semiconductor forming the channel region, the distance between the source region and the gate region being selected to be smaller than the mean free path of carriers.

According to this fourth feature described above, a thermionic emission type SIT of vertical structure is incorporated in an integrated circuit. Therefore, the required wiring is facilitated, and the area required for wiring connections can be reduced to about ⅔ of the prior art value, thereby ensuring integration with a high packaging density.

Other objects and features of the present invention will become apparent from the following detailed description taken in conjunction with the accompanying drawings.

BRIEF DESCRIPTION OF THE DRAWINGS

FIG. 1a is a schematic sectional view showing the construction of an embodiment of the thermionic emission type SIT according to the present invention.

FIG. 1b illustrates the operation of the SIT shown in FIG. 1a.

DESCRIPTION OF THE PREFERRED EMBODIMENTS

Figure 1:
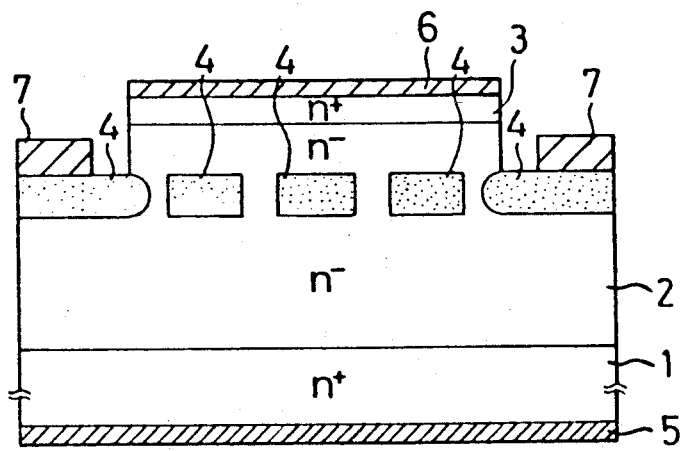
Figure 1:
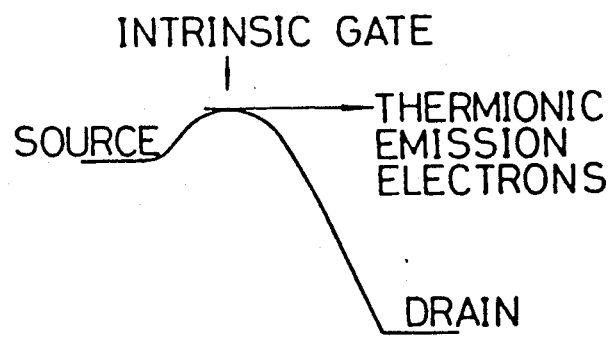

Suppose that all of carriers diffusing across the peak of a potential barrier in front of the source region of an SIT drift toward the drain region when the SIT is sized to have a small distance between the source region and the drain region so that the SIT can operate at a high speed. When the path of the carriers approaches the mean free path, the carriers drift at a very high speed without being substantially scattered by the crystal lattices.

The current density J in this case is given by the following equation (1):

$$J = \sqrt[q]{\frac{kT}{2\pi m^*}} \, n_s \exp\left( -\frac{q(\phi_{GS} - \eta V_G)}{kT} \right) \quad (1)$$

where q is the unit charge, k is the Boltzmann's constant, T is the absolute temperature, m* is the effective mass of the carriers, $n_s$ is the impurity concentration of the source region, $\phi_{GS}$ is the diffusion potential between the gate region and the source region, and $V_G$ is the potential applied to the gate region, respectively.

The cut-off frequency fc of the SIT when the carriers are now injected in a thermionic emission mode is given by the following equation (2) in which the second-stage input capacitance when the SIT is connected in cascade with another SIT is taken into consideration:

$$fc = \frac{\sqrt{\frac{kT}{2\pi m^*}}}{8.8 \, Wg} \quad (2)$$

where Wg is the width of the potential barrier in the gate region.

Therefore, the cut-off frequency fc of the SIT is about 780 GHz when GaAs is used as the semiconductor material and the width Wg of the potential barrier in the gate region is 0.1 μm.

It can be seen from the above discussion that the cut-off frequency fc of the SIT can be raised very high when the distance between the source region and the gate region is selected to be less than the mean free path of the carriers to provide the SIT of thermionic emission structure. Further, when the SIT of thermionic emission structure is so provided, its switching time is shortened, and the carriers drift over the intrinsic gate region without being scattered. Therefore, this transistor thus obtained can be easily integrated into an integrated circuit, since the mutual conductance Gm can be easily increased, and the current drive ability is high.

According to one of methods employed in the present invention to increase the mutual conductance Gm, the gate interval, that is, the channel width is determined on the basis of the Debye length which is taken as a criterion.

The Debye length $\lambda_D$ is given by the following equation (3):

$$\lambda_D = \sqrt{\frac{\epsilon kT}{nq^2}} \quad (3)$$

where n is the impurity concentration of the channel region, and ε is the dielectric constant, respectively.

According to the equation (3), the Debye length $\lambda_D$ is about 3.95 μm, 0.4 μm and 0.04 μm when the impurity concentration n is $10^{12} \text{cm}^{-3}$, $10^{14} \text{cm}^{-3}$ and $10^{16} \text{cm}^{-3}$, respectively. Generally, the mutual conductance Gm can be increased when the channel width is selected to be less than $2\lambda_D$. However, since the dimension control of the channel width in this case is determined by the accuracy of photolithography, it is necessary to determine the dimension of the channel width in relation to the fabrication technology.

Preferred embodiments of the thermionic emission type SIT and those of the integrated circuit including the SIT according to the present invention will now be described in detail with reference to the accompanying drawings.

FIG. 1a shows the structure of an embodiment of the thermionic emission type SIT according to the present invention. Referring to FIG. 1a, the SIT comprises a drain region 1 which is provided by an n+-type substrate of GaAs, a channel region 2 in the form of an n−-type layer formed on the substrate, and a source region 3 in the form of an n+-type layer in contact with the channel region 2. A buried layer of $Ga_{(1-x)}Al_xAs$ is provided in the channel region 2 to form a gate region 4. Although the gate region 4 is shown in section only in FIG. 1a, it is formed in a reticulate or linear pattern, and the illustrated portions are combined at their ends to be exposed to the surface. A gate electrode 7 is formed on the exposed portions of the gate region 4. The gate electrode 7 is formed of a metal making ohmic contact with the gate region 4. A drain electrode 5 and a source electrode 6 are formed on the lower surface of the drain region 1 and on the upper surface of the source region 3, respectively.

In the case of a compound semiconductor such as GaAs, a satisfactory electrical insulating film cannot be formed thereon. However, when a mixed crystal such as, for example $Ga_{(1-x)}Al_xAs$ whose forbidden band gap is larger than that of GaAs is used to form the gate region 4 as described above, the gate region can provide an electrical insulation similar to that provided by an $SiO_2$ film or the like.

In the channel region 2 defined between the source region 3 and the drain region 1 with the gate region 4 being formed therein in the transistor structure shown in FIG. 1a, the distance from the source region 3 to the intrinsic gate region 4 is selected to be less than the mean free path of carriers, so that a SIT structure of thermionic emission type can be obtained. The transistor thus obtained can operate as a normally-on type or a normally-off type by suitably selecting the distance between and the thickness of the portions of the gate region 4 and also suitably changing the impurity concentration of the channel region 2. The value of x in $Ga_{(1-x)}Al_xAs$ providing the gate region 4 is, for example, x=0.3. The mixed crystal is preferably undoped to such an impurity concentration that injection of carriers from the gate toward the channel region may not occur.

FIG. 1b shows the potential distribution in the channel region 2 including the gate region 4 therein and interposed between the source region 3 and the drain region 1.

In the embodiment shown in FIG. 1a, the gate-source capacitance Cgs and the gate-drain capacitance Cgd tend to become large.

Figure 2:
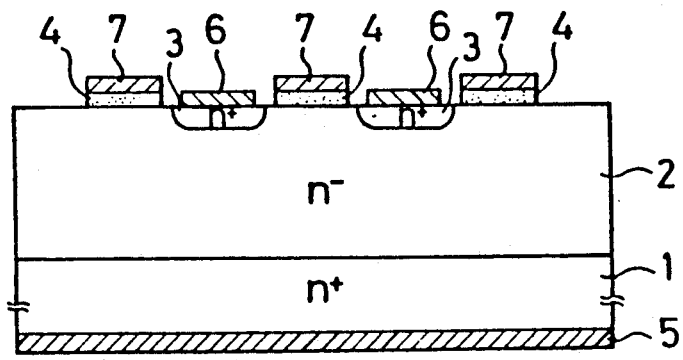
FIGS. 2 to 7 are schematic sectional views showing the construction of other embodiments respectively of the thermionic type SIT according to the present invention.

Such a problem is solved by another embodiment of the present invention shown in FIG. 2. According to the embodiment shown in FIG. 2, the gate-source capacitance Cgs can be decreased to a very small value. In FIG. 2, the same reference numerals are used to designate the same or equivalent parts appearing in FIG. 1a. It will be seen in FIG. 2 that the gate region 4 and the source region 3 are disposed on the same major surface thereby facilitating lead-out of the gate electrode 7, and both of the gate-source capacitance Cgs and the gate resistance Rg are decreased. Thus, the embodiment shown in FIG. 2 is advantageous in that the SIT can operate at a higher speed.

Figure 3:
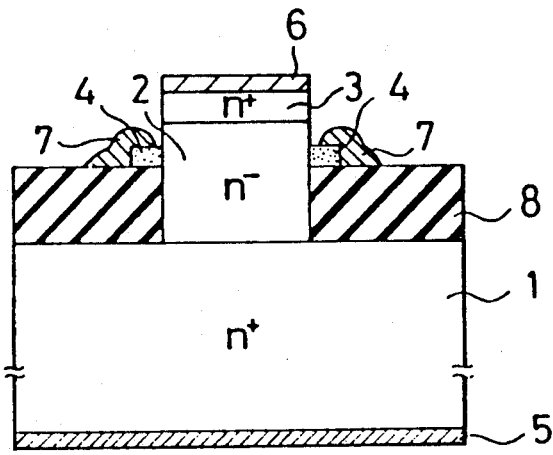

FIG. 3 shows still another embodiment of the present invention, and, in FIG. 3, the same reference numerals are used to designate the same or equivalent parts appearing in FIG. 1a. Referring to FIG. 3, a layer 8 of an electrical insulator is provided to decrease the gate-drain capacitance Cgd. The electrical insulator is preferably $SiO_2$, $Si_3N_4$, a polyimide region or the like. The dielectric constant of $Si_3N_4$ is about 5.5, that of $SiO_2$ is about 3.8 and that of the polyimide is about 3.2 in contrast to the dielectric constant, 11, of GaAs. Thus, the gate-drain capacitance Cgd is decreased to less than ½ of the value observed when GaAs, instead of the insulator, is present.

Figure 4:
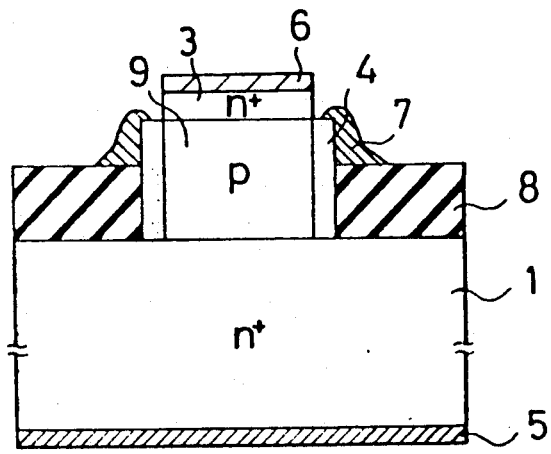

FIG. 4 shows still another embodiment of the present invention which is a partial modification of the embodiment shown in FIG. 3. It will be seen that the $n^-$-type channel region 2 in FIG. 3 is replaced by a p-type layer 9 providing the channel region. When the gate region 4 and the p-type layer 9 providing the channel region are inverted in state, and the portion of the p-type layer 9 in contact with the gate region 4 is turned into an n-type layer, electrons are injected from the source region 3 into the drain region 1 to place the SIT in operation.

Figure 5:
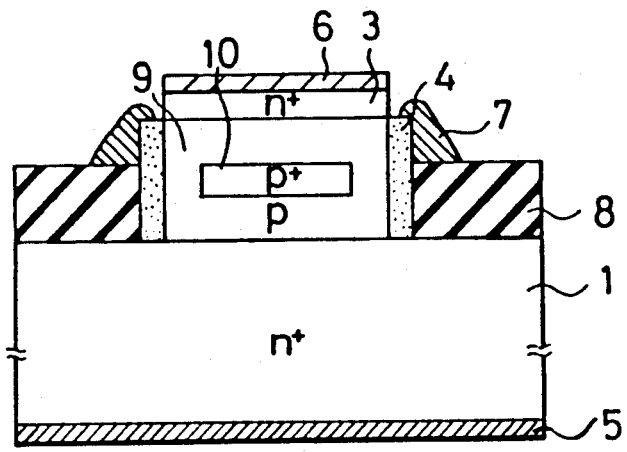

FIG. 5 shows another embodiment of the present invention which is a partial modification of the embodiment shown in FIG. 4. Referring to FIG. 5, a $p^+$-type region 10 having a high impurity concentration is formed in the p-type channel region 9 shown in FIG. 4 so that the flow of electrons injected from the source region 3 can be efficiently restricted by the gate region 4.

The buried region 10 provides a high potential barrier against the electrons injected from the source region 3. Therefore, the electrons drift through the both sides of the $p^+$-type region 10 buried in the p-type channel region 9. Since the side portion of the p-type channel region 9 in contact with the gate region 4 is the actually operating portion, the thickness of the source region 3 and that of the source electrode 6 may be, for example, about 0.5 μm, and this facilitates the manufacture of the SIT.

Figure 6:
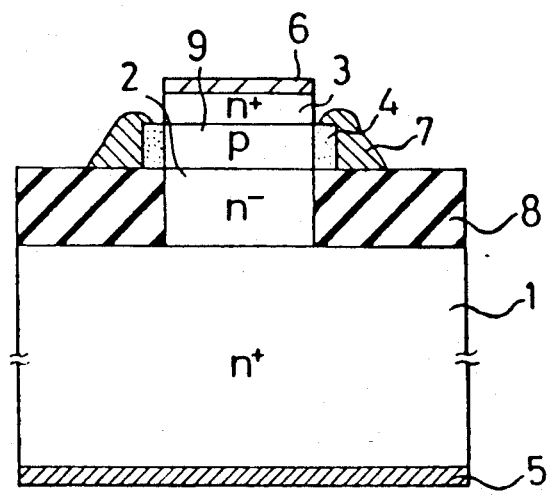
Figure 7:
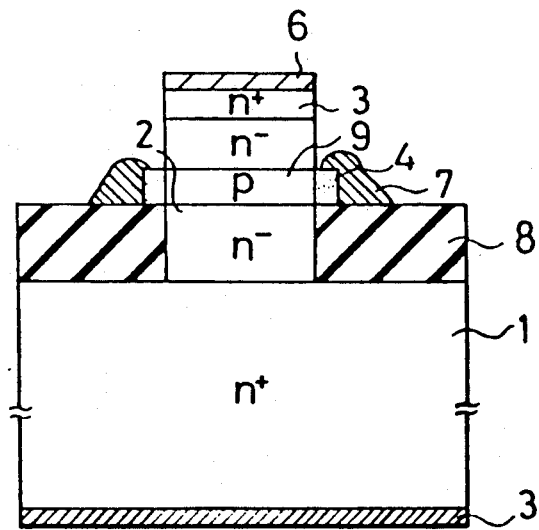

FIG. 6 shows still another embodiment of the present invention which is a partial modification of the embodiment shown in FIG. 4. Referring to FIG. 6, the p-type region 9 is replaced by the $n^-$-type region 2 except the portion making contact with the $n^+$-type source region 3. FIG. 7 is a partial modification of the embodiment shown in FIG. 6. Referring to FIG. 7, the p-type region 9 is inserted in the channel region 2 at a position near the source region 3, so as to decrease the gate-source capacitance Cgs and, also, to decrease the height of the gate region 4.

In all of the embodiments described with reference to FIGS. 1 to 7, the distance from the source region to the intrinsic gate region is selected to be less than the mean free path of carriers so that thermionic can be efficiently emitted.

The surface level of $Ga_{(1-x)}Al_xAs$ providing the gate region is required to be as low as possible relative to that of GaAs. For this purpose, a mixed crystal, such as, $Ga_{(1-x)}Al_xAs_{(1-y)}P_y$ which is obtained by doping a small quantity of phosphorus (P) into $Ga_{(1-x)}Al_xAs$, is preferably used, so that its lattice constant can be matched sufficiently with that of GaAs. The composition of $Ga_{(1-x)}Al_xAs_{(1-y)}P_y$ is preferably such that y is about 0.01 when x=0.3. By so attaining the coincidence between the semiconductor lattice constant of the gate region and that of the channel region, the source-gate breakdown voltage characteristic can be improved to decrease the leakage current and to reduce the power consumption.

The optimum distance Wdg' between the intrinsic gate region and the drain region for the output power is generally given by the following expression, provided that this distance is less than the mean free path of carriers:

$$Wdg' = \frac{v}{2\pi f} \quad (4)$$

where v is the velocity of electrons, and f is the operating frequency, respectively.

Suppose that the velocity of electrons is $1 \times 10^7$ cm/sec. Then, the values of Wdg' at 100 GHz, 300 GHz, 500 GHz, 700 GHz and 1,000 GHz (1 THz) are about 1,600 Å, 1,100 Å, 950 Å, 227 Å and 160 Å, respectively. In the case of GaAs operating with thermionic emission, the velocity of electrons is presumed to exceed the value of $1 \times 10^7$ cm/sec, and the value of Wdg' at each of the above frequencies becomes larger than the aforementioned calculated value. This yields the advantage that the SIT can be more easily manufactured than the prior art FET in which carriers drift at a saturated velocity.

Preferably, the impurity concentration of the channel region as compared to the i layer is selected to be about $10^7$ cm$^{-3}$, and that of the source and drain regions is selected to be about $1 \times 10^{18}$ cm$^{-3}$ to $1 \times 10^{20}$ cm$^{-3}$ for carrier injection.

Integrated circuits including the thermionic emission type SIT according to the present invention will now be described, hereinafter.

Figure 8:
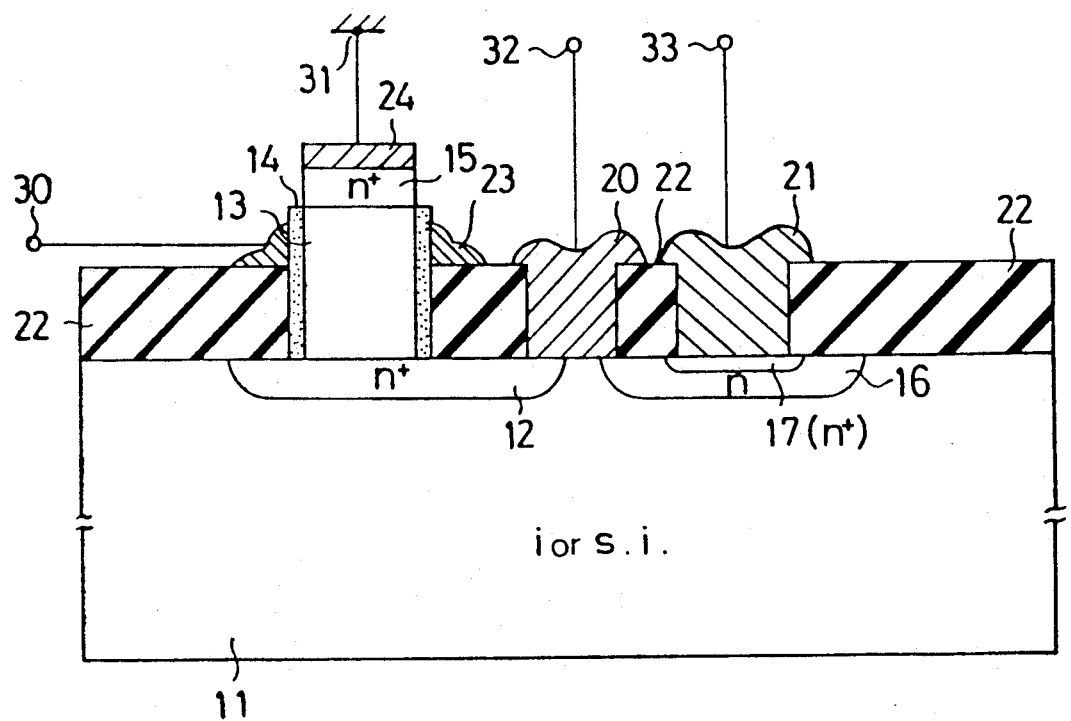
FIG. 8 is a schematic sectional view showing the construction of an embodiment of the semiconductor integrated circuit utilizing the thermionic emission type SIT according to the present invention.

FIG. 8 shows an embodiment of the integrated circuit according to the present invention. Referring to FIG. 8, a substrate 11 of GaAs, which is an intrinsic semiconductor i or a semi-insulating semiconductor s.i., is prepared, and an $n^+$-type buried layer providing a drain region 12 is formed in one of the major surfaces of the substrate 11. A channel region 13 is formed on the drain region 12. The impurity concentration of the drain region 12 is selected to be from $10^{18}$ cm$^{-3}$ to $10^{20}$ cm$^{-3}$, and that of the channel region 13 is selected to be from $10^{12}$ cm$^{-3}$ to $10^{18}$ cm$^{-3}$. The channel length is selected to be from 0.1 μm to 1.0 μm.

A hetero-junction gate region 14 is formed in contact with the side surface of the channel region 13. The gate region 14 is provided by a compound semiconductor, such as, $Ga_{(1-x)}Al_xAs$ or $Ga_{(1-x)}Al_xAs_{(1-y)}P_y$ whose forbidden band gap is larger than that of GaAs providing the substrate 11. In the composition of the hetero-junction gate region 14, x and y are selected to be about x=0.3 and y=0.01.

A source region 15 is formed on the channel region 13. The impurity concentration of this source region 15 is selected to be from $10^{18}$ cm$^{-3}$ to $10^{20}$ cm$^{-3}$.

On the other hand, an n-type layer providing a resistance region 16 is formed in the major surface of the substrate 11 of GaAs is proximity to the drain region 12, and an n⁻-type layer providing an electrode region 17 is formed in the resistance region 16. The impurity concentration of the resistance region 16 is selected to be from about $10^{18}$ cm$^{-3}$ to $10^{20}$ cm$^{-3}$.

An output electrode 20 is provided to cover part of the drain region 12 and the resistance region 16, and a power supply electrode 21 is provided on the electrode region 17. These electrodes are formed of a metal such as Al, Au, W or Pt.

The remaining area of the major surface of the substrate 11 of GaAs is covered with a film of an electrical insulator 22 such as $Si_3N_4$, $SiO_2$ of a polyimide resin. A gate electrode 23 is formed on the gate region 14 protruding upward through the insulator film 22, and a source electrode 24 is formed on the source region 15. The material of these electrodes 23 and 24 is similar to that of the electrodes 20 and 21.

An input terminal 30, a grounding terminal 21, an output terminal 32 and a power supply terminal 33 are connected to the gate electrode 23, source electrode 24, output electrode 20 and power supply electrode 21 respectively to form an integrated circuit.

Formation of the thermionic emission type SIT of the vertical structure on the substrate 11 of GaAs in the manner described above facilitates wiring connections to the drain region 12, gate region 14 and source region 15, so that the integrated circuit can be produced more easily than an integrated circuit of an FET or an HEMT where fine wiring connections to its source, gates and drain are required. Therefore, the area required for wiring connections can be reduced to about ⅔ of the prior art one so that large integration can be attained.

Figure 9:
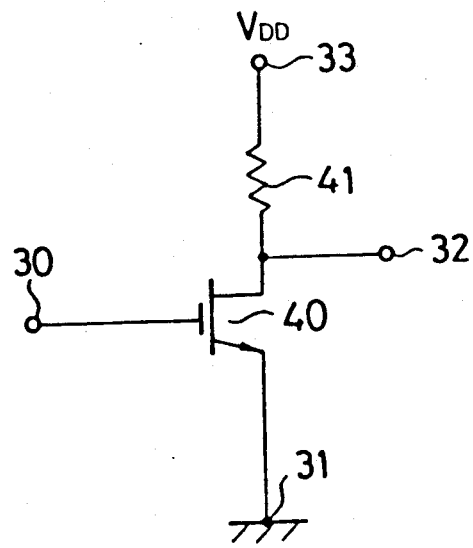
FIG. 9 is an equivalent circuit diagram of the integrated circuit shown in FIG. 8.

FIG. 9 shows an equivalent circuit of FIG. 8 and, in FIG. 9, the same reference numerals are used to designate the same parts appearing in FIG. 8. It will be seen that a load resistor 41 is connected to a thermionic emission type SIT 40 of normally-off characteristic shown in FIG. 9. When an input signal of low level is applied to the input terminal 30 is in the state in which the power supply voltage $V_{DD}$ is applied to the power supply terminal 33, the thermionic emission type SIT 40 remains in its off state, and an output signal of high level appears at the output terminal 32. On the other hand, when an input signal of high level is applied to the input terminal 30, the thermionic emission type SIT 40 is turned on, and an output signal of low level appears at the output terminal 32. Thus, the SIT 40 makes the so-called inverter action. In the circuit shown in FIG. 9, the value of the current is determined by the value of the load resistor 41. For example, when the load resistor 41 has a resistance value of 1 kΩ, and $V_{DD}$ is 1 volt, the current value is about 1 mA. In such a case, the on-voltage of the thermionic emission type SIT 40 is very low.

Figure 10:
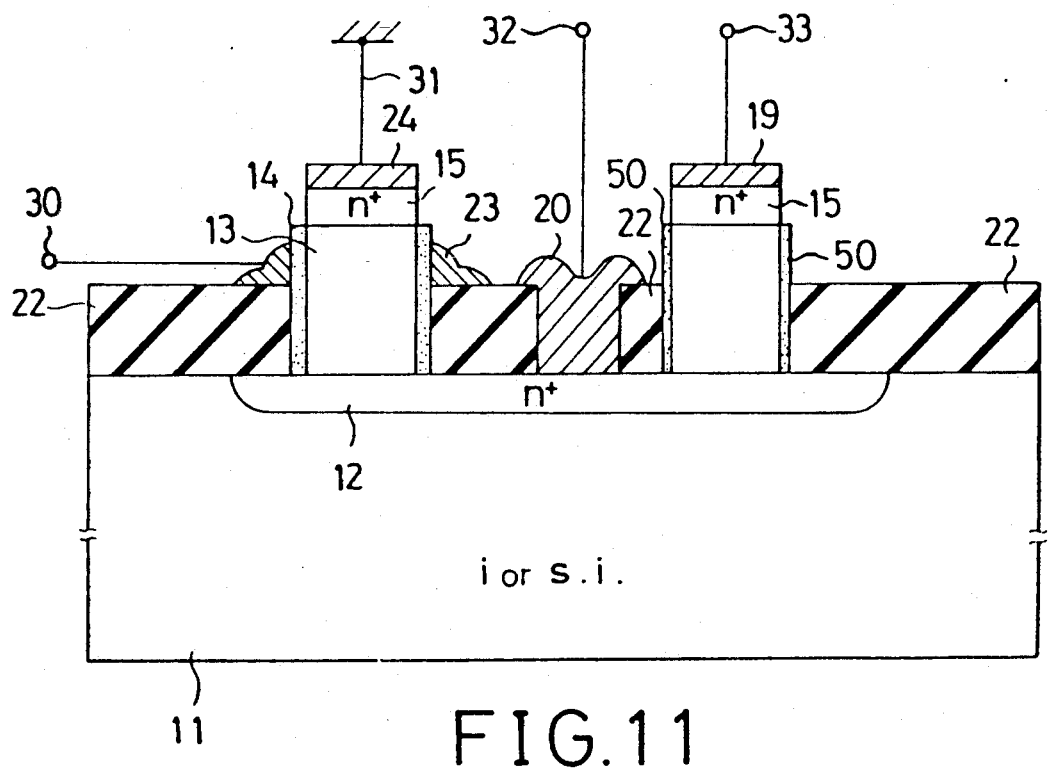
FIG. 10 is a schematic sectional view showing the construction of another embodiment of the semiconductor integrated circuit according to the present invention.

FIG. 10 shows another embodiment of the integrated circuit according to the present invention in which a thermionic emission type transistor of the depression mode provides a load resistor. In FIG. 10, in which the same reference numerals are used to designate the same or equivalent parts appearing in FIG. 8, the transistor acting as the load includes a gate region 50 having a thickness smaller than that of the normally-off transistor, so that the transistor makes a normally-on operation to function as the resistor. The remaining structure is the same as the semiconductor structure shown in FIG. 8, and any detailed description thereof is abbreviated. In the structure shown in FIG. 10, there is no need for separately providing the resistor, and, therefore, its production is facilitated correspondingly. In FIG. 10, the gate region 50 may be in contact with the source region 15.

The gate electrode 23 may be in direction contact with the channel region 13 of GaAs which is preferably of the n-type rather than the p-type. Furthermore, the load transistor may be a SIT or a conventional FET or the like.

Figure 11:
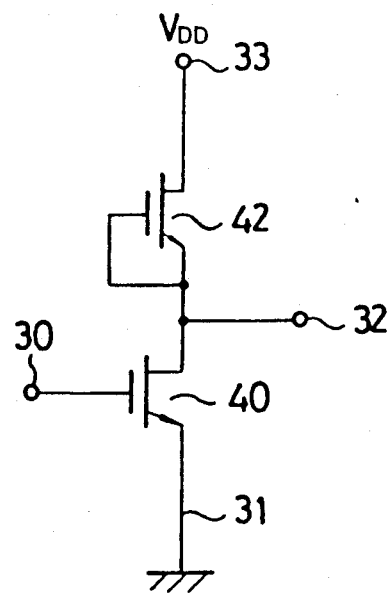
FIG. 11 is an equivalent circuit diagram of the integrated circuit shown in FIG. 10.

FIG. 11 shows an equivalent circuit of FIG. 10. It will be seen that a normally-on, thermionic emission type SIT 42 acting as an impedance element is connected to the thermionic emission type SIT 40 to constitute an inverter circuit. The operation of this inverter circuit is similar to that of the circuit shown in FIG. 9, and, therefore, any detailed description thereof is abbreviated.

It will be understood that the integrated circuit embodying the present invention employs a thermionic emission type transistor of vertical structure. Therefore, the present invention can provide a semiconductor integrated circuit which operates at a high speed with low power consumption, which facilitates wiring connections and which can be integrated with a high packaging density.

In the aforementioned embodiments of the present invention, the known technique of, for example, double-layer interconnections can be used for connection of the integrated circuit to the power source, ground and input and output terminals through a planar structure and an insulator. The material is in no way limited to GaAs and may be Si, InP, InAs, InSb or a II-V compound semiconductor. It is apparent that the material can also be provided by, for example, the combination of HgTe or CdTe with $Hg_{(1-x)}Cd_{(x)}Te$.

Further, the transistor and integrated circuit embodying the present invention can be formed by a molecular or photo exited molecular epitaxial growth process, which was invented by the one of the inventors and in which molecular layers of GaAs can be formed one after another in the epitaxial growth process. Similarly, the integrated circuit can be formed by a vapor phase epitaxy, a liquid phase epitaxy, an MO-CVD method, an MBE process, an ion implantation or diffusion process, a photolithography, plasma etching, a chemical etching, or any one of combinations of various vacuum evaporation processes.

We claim:

1. A static induction transistor of thermionic emission type comprising a channel region made of a semiconductor and having first and second sides, said channel region comprising a channel portion disposed so that any current flow within the channel region must pass through said channel portion, said channel portion being made of a semiconductor which is a first type of semiconductor which is one of a p-type and an n-type semiconductor, a source region and a drain region having a high impurity concentration and each formed in contact with a respective side of said channel region, said source and drain being made of a semiconductor which is the opposite of said first type, and a gate region making contact with at least part of said channel region, the gate region being formed of a semiconductor having a forbidden band gap larger than that of the semiconductor forming said channel region, the gate semiconductor region being undoped so that injection of carriers from the gate to the channel does not occur, the distance from the said source region to the gate region being selected to be smaller than the mean free path of carriers.

2. A static induction transistor as claimed in claim 1, wherein said channel region is formed of GaAs, and said gate region is formed of $Ga_{(1-x)}Al_xAs$.

3. A static induction transistor as claimed in claim 1, wherein said channel region includes a semiconductor region providing a higher potential barrier against carriers drifting from said source region than the remaining portion of said channel region.

4. A static induction transistor as claimed in claim 1, wherein a gate electrode provided in contact with said gate region is formed of a metal material making an ohmic contact with said gate region.

5. A static induction transistor comprising a channel region made of a semiconductor and having first and second sides, said channel region comprising a channel portion disposed so that any current flow within the channel region must pass through said channel portion, said channel portion being made of a semiconductor which is a first type of semiconductor which is one of a p-type and an n-type semiconductor, a source region and a drain region having a high impurity concentration and each formed in contact with a respective side of said channel region, said source and drain regions being made of a semiconductor which is the opposite of said first type, and gate region making contact with at least part of said channel region, the gate region being formed of a semiconductor having a forbidden band gap larger than that of semiconductor forming said channel region, the gate semiconductor region being undoped so that injection of carriers from the gate to the channel does not occur, the distance from said source region to the gate region being selected to be smaller than the mean free path of carriers, and the composition of the semiconductor forming said gate region being modified so as to attain coincidence between the semiconductor lattice constant of said gate region and that of said channel region.

6. A static induction transistor as claimed in claim 5, wherein said channel region is formed of GaAs, and said gate region is formed of $Ga_{(1-x)}Al_xAs_{(1-y)}P_y$.

7. A static induction transistor as claimed in claim 5, wherein a gate electrode provided in contact with said gate region is formed of a metal material making an ohmic contract with said gate region.

8. A static induction transistor as claimed in claim 5, wherein said channel region includes a semiconductor region providing a higher potential barrier against carriers drifting from said source region than the remaining portion of said channel region.

9. A semiconductor integrated circuit comprising an electrostatic induction transistor of thermionic emission type incorporated therein, said transistor comprising a drain region having a high impurity concentration and formed in part of at least one of the major surfaces of a substrate of one of an intrinsic semiconductor and a semi-insulating semiconductor, a channel region formed on said drain region, said channel region comprising a channel portion disposed so that any current flow within the channel region must pass through said channel portion, said channel portion being made of a semiconductor which is a first type of semiconductor which is one of a p-type and an n-type semiconductor, a source region formed on said channel region, said source and drain regions being made of a semiconductor which is the opposite of said first type, and a gate region disposed in contact with the side of said channel region and formed on a semiconductor having a forbidden band gap larger than that of the semiconductor forming said source region and said channel region, the gate semiconductor region being undoped so that injection of carriers from the gate to the channel does not occur, the distance between said source region and said gate region being selected to be smaller than the mean free path of carriers.

10. A semiconductor integrated circuits as claim in claim 9, wherein said channel region is formed of GaAs, and said gate region is formed of one of $Ga_{(1-x)}Al_xAs$ and $Ga_{(1-x)}Al_xAs_{(1-y)}P_y$.

11. A semiconductor integrated circuit comprising an electrostatic induction transistor of a thermionic emission type incorporated therein, said transistor comprising a drain region having a high impurity concentration and formed in part of at least a high impurity concentration and formed in part of at least one of the major surfaces of a substrate of one of an intrinsic semiconductor and a semi-insulating semiconductor, a channel region formed on said drain region, said channel region comprising a channel portion disposed so that any current flow within the channel region must pass through said channel portion, said channel portion being made of a semiconductor which is a first type of semiconductor which is one of a p-type and an n-type semiconductor, a source region having an impurity concentration of about $10^{18}cm^{-3}$ to $10^{20}cm^{-3}$ and formed on said channel region, said source and drain regions being made of a semiconductor which is the opposite of said first type, and a gate region disposed in contact with the side of said channel region and formed of a semiconductor having a forbidden band gap larger than that of the semiconductor forming said channel region, the gate semiconductor region being undoped so that injection of carriers from the gate to the channel does not occur, the distance between said source region and said gate region being selected to be smaller than the mean free path of carriers.

* * * * *